Jan. 10, 1967 R. J. FOREMAN ET AL 3,297,909

THERMALLY STABLE STRUCTURE FOR TUNABLE MAGNETRON

Filed Sept. 4, 1964 2 Sheets-Sheet 1

INVENTORS.
ROBERT J. FOREMAN
and JOHN B. HORRIGAN

BY David M. Keay

AGENT.

THERMALLY STABLE STRUCTURE FOR TUNABLE MAGNETRON

Filed Sept. 4, 1964 2 Sheets-Sheet 2

INVENTORS.
ROBERT J. FOREMAN
and JOHN B. HORRIGAN

BY David M. Keay

AGENT.

United States Patent Office 3,297,909
Patented Jan. 10, 1967

3,297,909
THERMALLY STABLE STRUCTURE FOR TUNABLE MAGNETRON

Robert J. Foreman and John B. Horrigan, Williamsport, Pa., assignors, by mesne assignments, to Litton Industries, Inc., Beverly Hills, Calif., a corporation of Delaware Filed Sept. 4, 1964, Ser. No. 394,478
5 Claims. (Cl. 315—39.61)

Figure 1:
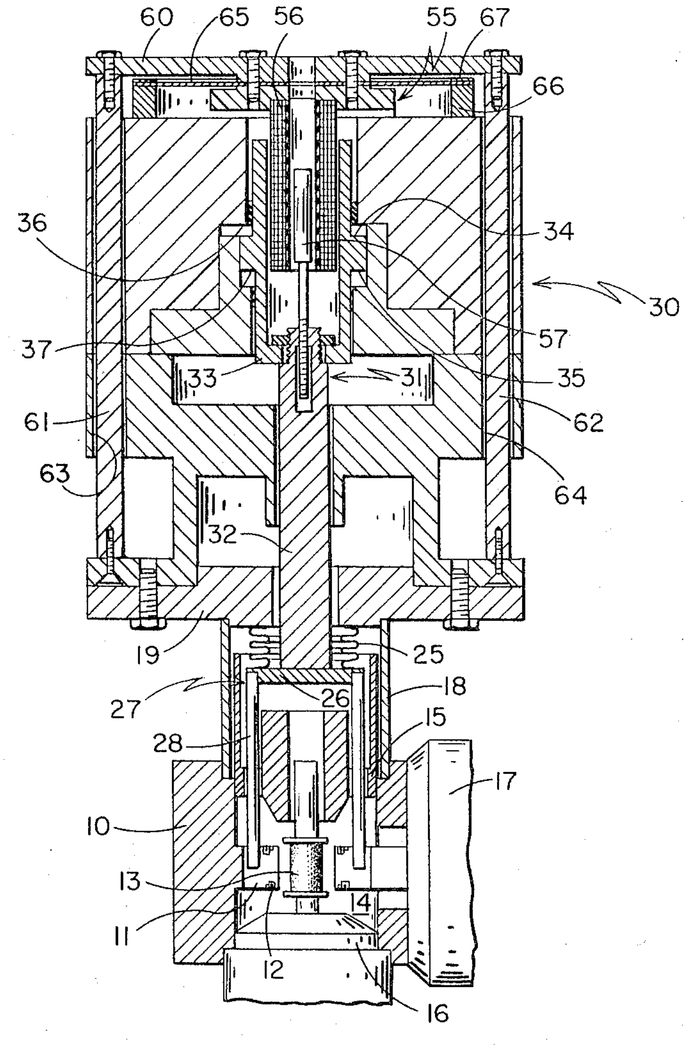

This invention relates to tunable magnetrons. More particularly, it is concerned with a thermally stable structure for supporting portions of a magnetron tuning mechanism.

For certain applications the output frequency of a magnetron must be varied rapidly and continually over a particular tuning range. Tuning is accomplished by a tuning member within the evacuated chamber of the magnetron which is moved relative to the resonant cavity structure of the magnetron so as to change the frequency of resonance. In one type of tunable magnetron the tuning member is moved by a hydraulic system which is controlled by electrical signals. The tuning member is sealed to the walls of the evacuated chamber by a flexible bellows, and it is attached to a tuner drive which is located externally of the chamber. The tuner drive is mounted in a housing commonly referred to as the tuner actuator, which contains channels for applying a hydraulic fluid to the tuner drive so as to obtain reciprocal movement of the tuner drive and consequently of the attached tuning member.

The position of the tuning member with respect to the resonant cavity structure is sensed by a two-part transducer. In these prior art devices a first element of the transducer is fixedly mounted on the tuner actuator and a second element is fixed to the tuner drive. When an electrical voltage is applied at the input terminals of one of these elements, an output voltage which is dependent on the input voltage and on the relative positions of the two elements is obtained at the output terminals of the one element.

The output signal from the transducer is employed in a bridge circuit. When the bridge is in an unbalanced condition, an output signal from the bridge circuit causes the hydraulic system to move the tuner drive in the direction which changes the position of the second element of the transducer with respect to the first element so as to change the output voltage of the transducer to a value restoring the balanced condition of the bridge circuit. Movement of the tuning member attached to the tuner drive changes the frequency of resonance of the resonant structure of the magnetron.

The output frequency of the magnetron can thus be tuned by a signal applied to an element of the bridge circuit thereby unbalancing the bridge circuit. The bridge is restored to the balanced condition by the foregoing actions which also alter the oscillating frequency of the magnetron.

For various reasons including ease of machining and fabrication the tuner actuator, including those portions providing support for the aforementioned first element, is usually made of aluminum, a material having a high coefficient of thermal expansion. Under certain operating conditions the temperature of the magnetron including the tuning mechanism may vary over a wide range. Consequent thermal expansion or contraction causes some elements of the magnetron to be shifted with respect to other elements.

Thermal expansion of the tuner actuator causes the first element of the transducer which is fixed to the tuner actuator to start to shift outward with respect to the tuner drive and the second element of the transducer. Immediately the resulting output signal from the transducer unbalances the bridge circuit thereby actuating the hydraulic system. The tuner drive is moved thus moving the second element to its original position with respect to the first element and restoring the bridge circuit to its balanced condition. In other words, the two elements of the transducer can be considered as locked together, and as the first element is moved outward the second element is carried with it. The consequent movement of the tuning member with respect to the resonant cavity structure tends to produce an undesired shift in the output frequency of the magnetron.

The various factors which affect the temperature of the device do not affect all elements equally or simultaneously. Thus, it has proved impractical to produce a thermally compensated device through the expedient of structures in which the effects of the expansion of some elements in one direction are cancelled out by the effects of the expansion of other elements in the opposite direction.

It is an object of the present invention, therefore, to provide a tunable magnetron having improved frequency stability.

It is another object of the invention to provide a thermally stable structure for mounting an element on the body of a device.

It is also an object of the invention to provide a hydraulically tuned magnetron in which undersired frequency changes caused by variations in the temperature of the tuning mechanism are minimized.

Briefly, in accordance with the foregoing objects of the invention a thermally stable structure is provided for mounting one of the elements of the transducer on the body of a magnetron device. The structure includes a supporting plate adapted to have the element mounted centrally thereon. Support rods of a material having a coefficient of thermal expansion which is low relative to that of the body of the device each having one end fixed to the body and the other end fixed to the supporting plate at the outer periphery of the plate. A thin, flat, flexible diaphragm which lies generally transverse to the support rods has its central portion fixed to the central portion of the supporting plate and its outer periphery fixed to a portion of the body. The support rods position the transducer element spaced from the body and support the element with respect to the body on structure which has a relatively low coefficient of thermal expansion. Thus, the position of the transducer element is independent of thermal expansion and contraction of the body. The diaphragm does not provide support for the transducer element, but prevents movement of the element in directions transverse to the support rods while permitting relative movement between the element and the body along the direction of the length of the rods.

Figure 2:
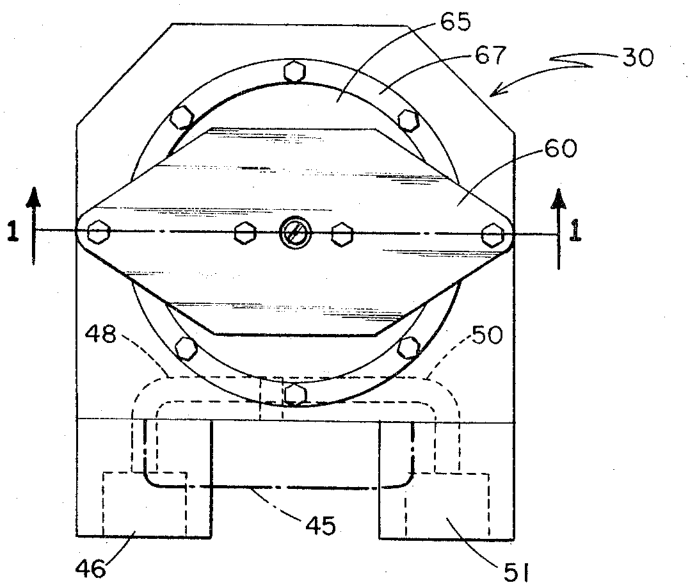
Figure 3:
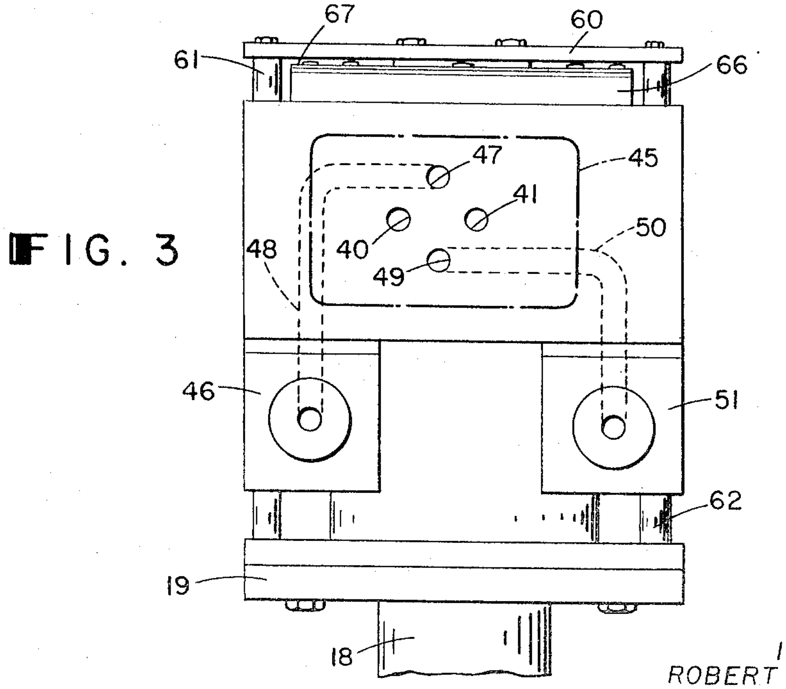

Additional objects, features, and advantages of the invention will be apparent from the following detailed discussion and the accompanying drawings wherein:

FIG. 1 is a fragmentary elevational view partially in cross-section illustrating a magnetron embodying the invention, FIG. 2 is a plan view of the magnetron of FIG. 1, and FIG. 3 is an elevational view in full of a portion of the magnetron of FIGS. 1 and 2.

The magnetron incorporating the invention as illustrated in the drawings includes a cylindrical anode block 10 which constitutes a portion of the body of the device. A plurality of vanes 11 extend radially inward from the block to provide a plurality of cavity resonators lying in a circular array about the central axis of the anode. The anode is strapped with pair of concentric metal rings 12 located in recesses in each end of the vanes. Each strapping ring is connected only to alternate vanes in the manner well known in the art to insure operation of the magnetron in the $\pi$ mode. An electron emissive cathode 13 is positioned centrally of the anode and spaced from the tips of the vanes. The anode vanes and the cathode are located within a sealed, evacuated chamber 14. Upper and lower pole pieces 15 and 16 are arranged to direct a magnetic field from permanent magnets (not shown) through the chamber. The cathode passes through a bore (not shown) in the lower pole piece. The lower end of the chamber is hermetically sealed by a suitable sealing arrangement between the anode block, lower pole piece, and cathode. Electromagnetic energy is coupled from the magnetron by an output coupler 17 extending through the anode block and communicating with one of the cavity resonators.

The upper pole piece 15 is encircled by a cylindrical sleeve 18 sealed to the anode block 10. The sleeve 18 is sealed to a plate 19. One end of a flexible bellows 25 is sealed to the plate. The other end of the bellows is sealed to the tuning pin support 26 of the tuning member 27, thus completing a hermetic seal at the upper end of the chamber 14.

The tuning member 27 includes the tuning pin support 26 and a plurality of tuning pins 28 each of which is associated with one of the cavity resonators. Each tuning pin 28 extends through an opening in the upper pole piece 15 and into a cavity resonator formed by a pair of vanes 11. Movement of the tuning member along the direction of the axis of the anode causes the tuning pins to move into and out of the cavity resonators thereby changing the frequency of resonance of the resonators.

A tuner actuator 30 is mounted on the body of the magnetron proper at the plate 19. The tuner drive 31 which moves the tuning member 27 is mounted within the body of the actuator. The tuner drive 31 includes a tuner driving rod 32 the lower end of which is fixed to the tuning member 27. The other end of the rod is secured to a piston 33. The piston and rod are supported in passages in the actuator body so as to permit reciprocal movement along the direction of the axis of the magnetron.

The piston 33 has two opposed surfaces 34 and 35. The upper surface 34 of the piston lies in an upper chamber 36 in the actuator body and the lower surface 35 lies in a lower chamber 37. These chambers which are suitably sealed from each other and from other channels in the body are connected by passages (not shown) to a first driving port 40 and a second driving port 41, respectively, at the outer surface of the actuator body, as shown in FIG. 3. The chambers 36 and 37 and their connecting passages are adapted to contain hydraulic fluid under pressure. Thus, when there is a pressure differential in the fluid at the tuner driving ports 40 and 41, the piston is moved away from the chamber under the higher pressure toward the chamber under the lower pressure. When the pressure in the chamber is equalized, the piston remains stationary at the position to which it has been moved.

The pressure of the fluid at the driving ports 40 and 41 is controlled by a suitable electrically actuated valve mechanism 45, the outline of which is shown in phantom in FIGS. 2 and 3. Hydraulic fluid under high pressure is supplied to the valve mechanism from an intake connection 46 in the actuator body which is connected to a pressure port 47 at the outer surface of the body by a passage 48. The fluid passes out of the valve through a return port 49 by way of a passage 50 to an outlet connection 51. Hydraulic fluid flows continually into the intake connection 46 through the passages in the actuator body, through the valve mechanism 45, and out through the outlet connection 51.

Under conditions of no electrical signal to the valve mechanism the pressure of hydraulic fluid passing through the valve is applied equally to both the first and second driving ports 40 and 41. The presence of an electrical signal causes the valve mechanism to alter the course of the fluid flowing through the valve mechanism so as to apply a higher pressure to one of the two driving ports than to the other. The sense of the electrical signal applied determines which driving port will be placed under the higher pressure.

All of the above-described hydraulic arrangement and the bridge circuit for maintaining a balanced condition in the tuner are conventional and well known to those skilled in the art. Since these elements form no part of the present invention, the hydraulic structure is shown only schematically and the bridge circuit and its associated components are not shown—it being understood that these portions of the shown magnetron are conventional, readily available on the market and well known to those skilled in the art.

The magnetron tuning apparatus includes a two-part transducer 55 which is employed to sense the position of the tuning member 27 with respect to the anode 10. The first or outer element 56 of the transducer is essentially a transformer having input leads to a primary winding and output leads from a secondary winding. The second or inner element 57 of the transducer is the moveable core of the transformer. The voltage produced at the output leads of the transducer is dependent on the input voltage applied to the input leads and the position of the inner element 57 with respect to the outer element 56.

In accordance with the present invention, the outer element 56 of the transducer is fixed to the central portion of a supporting plate 60 which lies above the body of the tuner actuator. The supporting plate is fixedly mounted on one end of each of two support rods 61 and 62. The rods lie parallel to the axis of the magnetron and they are located diametrically opposite to the axis from each other. The rods pass freely through passages or openings 63 and 64 in the body of the actuator. Each of the rods is attached at its lower end to the lower portion of the actuator body adjacent the plate 19 on which the actuator section of the body of the device is mounted.

The support rods are fabricated of a material having a low coefficient of thermal expansion relative to that of the materials employed in the body of the device, particularly the material of the tuner actuator section of the body. Molybdenum has been found to provide a very satisfactory material for the support rods. Molybdenum has a coefficient of linear thermal expansion of about $5\times10^{-6}/°$ C. compared to a coefficient of linear thermal expansion of about $24\times10^{-6}/°$ C. for aluminum, which is the material of the actuator body. Since the rods are simple elements of structure, difficult to fabricate materials having a very low coefficient of thermal expansion may be used. For example, under certain conditions rods may be employed which are fabricated of fused silica which has a coefficient of linear thermal expansion of about $0.5\times10^{-6}/°$ C.

The supporting structure for the outer element of the transducer also includes a thin, flat diaphragm 65 which has its central portion attached to the central portion of the supporting plate 60 and its outer periphery fixed to the upper portion of the actuator body. The diaphragm is a flexible disc of a material such as, for example, a non-magnetic stainless steel. The outer periphery of the diaphragm is fixed to an annular support 66 on the upper end surface of the actuator body by means of a retaining washer 67. The central portion of the diaphragm is securely bolted to the central portion of the supporting plate 60 and to the outer element 56 of the transducer. These items are all positioned coaxially of the magnetron.

The arrangement of structure as described provides a mounting for the outer element of the transducer which is relatively thermally stable with respect to the magnetron proper. The support rods 61 and 62 maintain the element supporting plate 60 at a distance from the magnetron proper along the direction of the axis which varies only slightly with temperature. The variation in distance is entirely independent of the expansion or contraction of the tuner actuator body.

While the support rods 61 and 62 provide stable mounting for the transducer element along the direction of the magnetron axis in such a way as to by-pass the high expansion tuner actuator body, the diaphragm 65 provides a stable mounting in directions transverse to the axis. Although the diaphragm is a rigid element of structure to forces parallel to the plane in which it lies, it flexes to permit movement to a certain extent in a direction normal to its plane. Thus, variations in distance between the upper end of the tuner actuator body on which the annular support 66 is mounted and the transducer element supporting plate 60 occur without restraint being imposed by the diaphragm. The inner element 57 of the transducer, which is the core of a transformer is attached to the upper end of the tuner driving rod 32. As mentioned above, the voltage at the output of the transducer depends on the voltage at the input and on the position of the inner element with respect to the outer element. Under operating conditions the output signal from the transducer is employed as an input to a bridge circuit. Any unbalance in the bridge circuit produces a signal which is applied to the electrically actuated valve mechanism 45. The valve causes a pressure differential in the hydraulic fluid in the upper and lower chambers 36 and 37, thus causing the piston 33 to move. As the piston and tuner driving rod are moved, the tuning member 27 is also moved thus changing the output frequency of the magnetron.

The magnetron is tuned by a tuning signal applied to one of the elements of the bridge circuit to unbalance the circuit. The manner in which the unbalanced condition of the bridge circuit causes the tuner drive 31 to move along the axis of the magnetron carrying the tuning member 27 and inner element 57 of the transducer along with it has been explained above. The direction of movement is such as to carry the inner element 57 of the transducer toward a position which will change the output voltage of the transducer to a value which balances the bridge circuit. When the inner element of the transducer is in position and the bridge circuit balanced, the signal to the valve mechanism 45 terminates. The valve mechanism returns to its normal no-signal condition and the fluid pressure at the driving ports 40 and 41 is equalized. The tuner drive 31 and the attached tuning member 27 remain at the position to which they have been moved. In this manner the position of the tuning pins 28 with respect to the cavity resonators of the magnetron anode 10 is changed by the application of electrical tuning signals to an element of the bridge circuit, thereby tuning the output frequency of the magnetron.

It can be seen that under steady-state conditions of no tuning signal if an action occurs tending to shift the position of the transducer elements with respect to each other, the hydraulic system will maintain the elements in the same relative position thereby causing an undesired shift in the frequency of oscillation of the magnetron. In prior art devices the outer element of the transducer commonly was mounted directly on the upper end of the tuner actuator section of the body. Thermal expansion or contraction of the aluminum actuator body would tend to move the outer element of the transducer with respect to the inner element causing the hydraulic system to operate in order to maintain the two elements of the transducer in the same relative position and thereby change the frequency of the magnetron.

With the structure according to the invention as described, however, the outer element of the transducer is isolated from the tuner actuator body. Since the support rods 61 and 62 are of molybdenum, or other material having a low coefficient of thermal expansion, the amount they expand is small relative to the expansion of the tuner actuator body which has a high coefficient of thermal expansion. In addition, the relatively small amount of movement of the outer element of the transducer which does occur can be at least partially compensated for by the use of a tuner driving rod 32 which is also of a material having a low coefficient of thermal expansion, for example, molybdenum. Mechanical stability of the outer element of the transducer with respect to the remainder of the magnetron in directions transverse to the axis is obtained by the diaphragm arrangement as explained hereinabove. Thus, a stable, vibration-proof, thermally stable structure is provided for mounting the outer element of the transducer, thereby providing a hydraulically tunable magnetron having improved freqency stability.

What is claimed is:

1. In a tunable resonant cavity device in which the frequency of the resonant cavity is varied by movement of a tuning member with respect to the body of the device and the position of the tuning member with respect to the body is sensed by a two-element position sensing device one element of which is fixedly mounted with respect to the body and the other element of which is fixedly mounted with respect to the tuning member, structure for mounting the one element on the body including
   - a supporting plate, means for mounting the one element on the supporting plate,
   - support rods of a material having a coefficient of thermal expansion which is low relative to that of the body of the device, one end of each of said rods being fixed to the body of the device and the other end of each of the rods being fixed to the supporting plate at the outer periphery thereof, and
   - a thin, flat diaphragm lying generally transverse to the support rods, and having its central portion fixed to the central portion of the supporting plate and its outer periphery fixed to a portion of the body of the device.

2. A tunable resonant cavity device including in combination
   - a body having a cavity resonator therein,
   - a tuning member movable with respect to the body to vary the resonant frequency of the cavity resonator,
   - a tuner drive attached to the tuning member,
   - a portion of the body having means movably supporting the tuner drive,
   - means in said portion of the body for moving the tuner drive thereby moving the tuning member with respect to the body,
   - a position sensing device comprising first and second elements and means for providing an output signal responsive to the position of the first element with respect to the second element,
   - a first element of the position sensing device being mounted on the tuner drive,
   - a supporting plate having the second element of the position sensing device mounted centrally thereon,
   - support rods of a material having a coefficient of thermal expansion which is low relative to that of the body, one end of each of said rods being fixed to the body and the other end of each of the rods being fixed to the supporting plate at the outer periphery thereof, and
   - a thin, flat diaphragm lying generally transverse to the support rods, and having its central portion fixed to the central portion of the supporting plate and its outer periphery fixed to the portion of the body.

3. A tunable resonant cavity device including in combination
   - an anode having a cavity resonator therein mounted within the body of the device,
   - a tuning member moveable with respect to the anode to vary the resonant frequency of the cavity resonator,
   - a tuner drive attached to the tuning member,
   - a section of the body of the device having means moveably supporting the tuner drive, channel means in said section of the body for applying a fluid medium to the tuner drive to cause movement of the tuner drive, a position sensing device comprising first and second elements and means for providing an output signal responsive to the position of the first element with respect to the second element, the first element of the position sensing device being mounted on the tuner drive, a supporting plate having the second element of the position sensing device attached centrally thereon, support rods of a material having a low coefficient of thermal expansion relative to that of said section of the body, each attached at one end to the outer periphery of the supporting plate and at the other end to the body of the device, and a thin, flat diaphragm lying generally transverse to the support rods and having its central portion attached to the central portion of the supporting plate and its outer periphery fixed to the section of the body.

4. A tunable resonant cavity device comprising a first body section having an evacuated chamber, an anode having a cavity resonator therein mounted within the chamber, a hermetically sealed bellows having one end sealed to said first body section, a tuning member within the chamber sealed to the other end of said bellows, said tuning member being movable with respect to the anode to vary the frequency of resonance of the cavity resonator, a second body section, a tuner drive supported in the second body section and adapted to be moved with respect thereto, said tuner drive being fixed to the tuning member whereby movement of the tuner drive causes movement of the tuning member in the evacuated chamber, channel means in the second body section for applying a fluid medium under pressure against the tuner drive to move the tuner drive, a position sensing device comprising first and second elements and means for providing an output signal responsive to the position of the first element with respect to the second element, the first element of the position sensing device being attached to the tuner drive, support rods of a material having a low coeffcient of thermal expansion relative to that of the second section of the body, said support rods each being fixed at one end to the second body section adjacent the first body section and extending parallel to each other through openings in the second body section whereby the rods may expand along their length an amount different from the amount of expansion of the second body section, a supporting plate attached at its outer periphery to the other end of each of said rods and having the second element of the position sensing device attached centrally thereon, and a thin, flat diaphragm lying generally transverse to the support rods and having its centrally portion attached to the central portion of the supporting plate and its outer periphery fixed to the second body section.

5. A tunable multi-cavity magnetron comprising a first body section having an evacuated chamber, an anode within said chamber having a plurality of cavity resonators disposed in a circular array about the axis of the anode, a hermetically sealed bellows centered along the axis and having one end sealed to said first body section, a tuning member within the chamber sealed to the other end of said bellows said tuning member being movable along the direction of the axis to vary the frequency of resonance of the cavity resonators, a second body section, a tuner drive supported in the second body section and adapted for reciprocal movement along the axis, one end of the tuner drive being fixed to the tuning member whereby movement of the tuner drive causes movement of the tuning member in the evacuated chamber, a first channel means in the second body section for applying a fluid medium to the tuner drive whereby the pressure of the medium on the tuner drive tends to move the tuner drive in one direction along the axis, a second channel means in the second body section for applying a fluid medium to the tuner drive whereby the pressure of the medium on the tuner drive tends to move the tuner drive in the opposite direction along the axis, the tuner drive being moved in the one direction or in the opposite direction by a differential in the pressures of the fluid mediums in the two channel means, a position sensing device comprising first and second elements and means for providing an output signal responsive to the position of the first element with respect to the second element, the first element of the position sensing device being attached to the other end of the tuner drive and lying along the axis, first and second support rods of a material having a coefficient of thermal expansion which is low with respect to that of the second section of the body disposed diametrically opposite the axis from each other and extending parallel to the axis, one end of each of said support rods being fixed to the end of the second body section adjacent the first body section, the other end of each of said support rods being located beyond the end of the second body section removed from the first body section, said second body section having openings therein through which said support rods pass whereby the rods may expand along their length an amount different from the amount of expansion of the second body section, a supporting plate lying generally transverse to the axis and attached at its outer periphery to said other ends of the support rods, and a thin, flat diaphragm lying generally transverse to the axis and having its central portion attached to the central portion of the supporting plate and its outer periphery fixed to the end of the second body section removed from the first body section, the second element of the position sensing device lying along the axis and being fixed to the central portion of the supporting plate and to the central portion of the diaphragm.

References Cited by the Examiner

UNITED STATES PATENTS

| | | | |
|---|---|---|---|
| 2,752,576 | 6/1956 | Hilliard et al. | 333—83 |
| 3,209,200 | 9/1965 | Nelson et al. | 333—83 |

HERMAN KARL SAALBACH, *Primary Examiner.*

P. L. GENSLER, *Assistant Examiner.*